(12) United States Patent
Ahn et al.

(10) Patent No.: US 7,969,220 B2
(45) Date of Patent: Jun. 28, 2011

(54) DELAY CIRCUIT

(75) Inventors: Seung-Joon Ahn, Gyeonggi-do (KR); Jong-Chern Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/491,567

(22) Filed: Jun. 25, 2009

(65) Prior Publication Data

US 2010/0244920 A1 Sep. 30, 2010

(30) Foreign Application Priority Data

Mar. 30, 2009 (KR) .................. 10-2009-0026916

(51) Int. Cl.
*H03H 11/26* (2006.01)

(52) U.S. Cl. ...................... 327/261; 327/276

(58) Field of Classification Search .............. 327/261, 327/276–278, 284–285
See application file for complete search history.

(56) References Cited

U.S. PATENT DOCUMENTS

| | | | | |
|---|---|---|---|---|
| 5,109,394 A * | 4/1992 | Hjerpe et al. | ................ | 375/373 |
| 6,985,401 B2 | 1/2006 | Jang et al. | | |
| 7,167,035 B2 * | 1/2007 | Cao | ................ | 327/261 |
| 7,282,971 B2 * | 10/2007 | Panpalia et al. | ................ | 327/149 |
| 7,366,966 B2 | 4/2008 | LeBerge | | |
| 7,417,482 B2 * | 8/2008 | Elgebaly et al. | ................ | 327/278 |
| 7,453,297 B1 * | 11/2008 | Kaviani | ................ | 327/161 |

FOREIGN PATENT DOCUMENTS

WO   WO 2007/088211   8/2007

OTHER PUBLICATIONS

Notice of Preliminary Rejection issued from Korean Intellectual Property Office on Oct. 18, 2010.

* cited by examiner

*Primary Examiner* — An T Luu
(74) *Attorney, Agent, or Firm* — IP & T Group LLP (57) ABSTRACT

A delay circuit includes first and second selective delay stages each including a number of unit delay cells to delay signals applied thereto; and a delay control unit configured to control selectively applying an input signal to the first selective delay stage or the second selective delay stage in response to a code combination of first and second selection signals and produce an output signal.

11 Claims, 6 Drawing Sheets

DELAY CIRCUIT

CROSS-REFERENCE TO RELATED APPLICATION

The present application claims priority of Korean patent application number 10-2009-0026916, filed on Mar. 30, 2009, the disclosure of which is incorporated herein by reference in its entirety.

BACKGROUND OF THE INVENTION

The present application relates to a semiconductor design technology, and more particularly, to technology for configuring a delay circuit.

Figure 1:
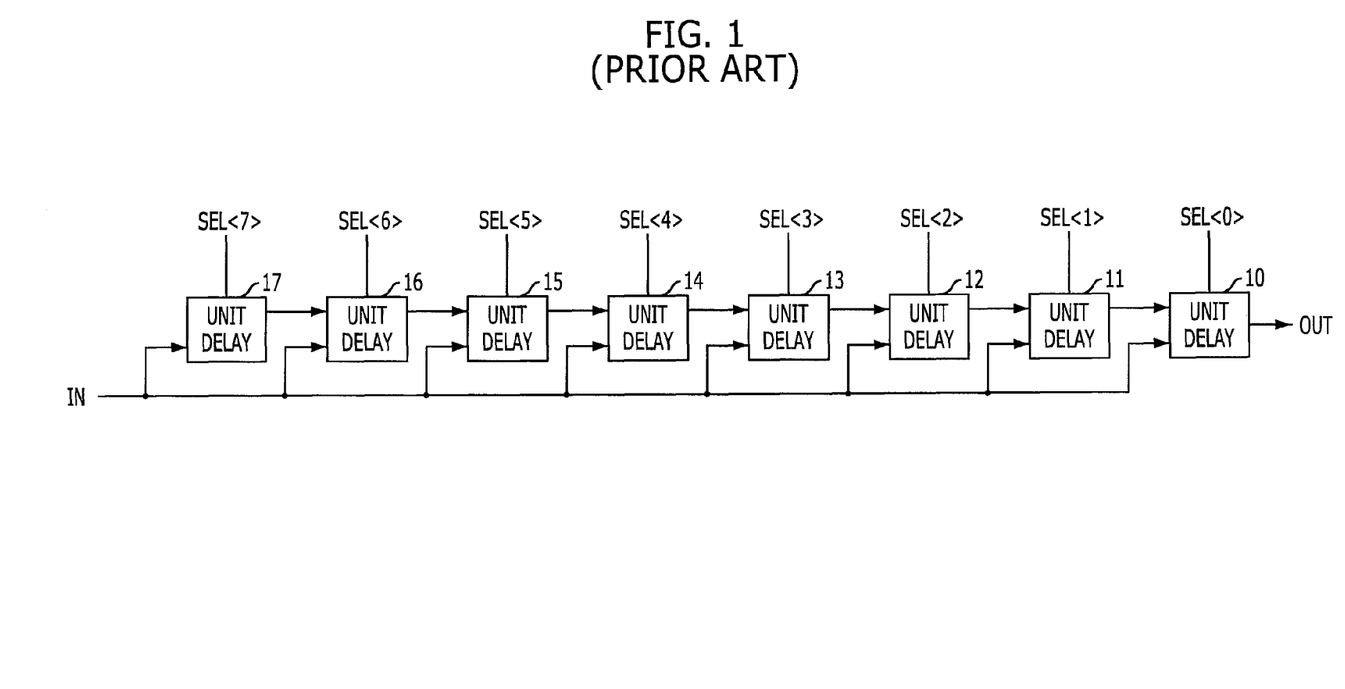
FIG. 1 is a block diagram of a conventional delay circuit.

FIG. 1 is a block diagram of a conventional delay circuit. Referring to FIG. 1, the conventional delay circuit includes a plurality of unit delays 10 to 17 connected in series. A plurality of selection signals SEL<0:7> are allocated to the plurality of unit delays 10 to 17, respectively. The unit delays 10 to 17 selectively transfer their input signals to next unit delays in response to the selection signals SEL<0:7>.

The delay circuit controls eight unit delays 10 to 17 in response to eight selection signals SEL<0:7>.

When the first selection signal SEL<0> is activated and the other selection signals SEL<7:1> are deactivated, the input signal IN is delayed by the first unit delay 10.

When the first and second selection signals SEL<1:0> are activated and the other selections signals SEL<7:2> are deactivated, the input signal IN is delayed by the second unit delay 11 and then delayed by the first unit delay 10.

When the first to third selection signals SEL<2:0> are activated and the other selection signals SEL<7:3> are deactivated, the input signal IN is delayed by the third unit delay 12, the second unit delay 11, and the first unit delay in sequence.

That is, the delay circuit of FIG. 1 determines the delay value of the input signal IN in response to the number of the successively activated selection signals, starting from the first selection signal SEL<0>.

The conventional delay circuit can generate eight delayed signals having different delay values by using the eight selection signals and the eight unit delays. That is, N delayed signals can be generated by using N-bit selection signals and N unit delays, where N is a natural number. However, the conventional delay circuit needs a lot of selection signals and a lot of unit delays in order to generate delayed signals having different delay values. Thus, the overlapping of the circuits increases and thus a circuit area increases.

SUMMARY OF THE INVENTION

Embodiments of the present application are directed to providing a delay circuit which occupies a small area and is capable of generating delayed signals having different delay values by using a small number of selection signals.

Embodiments of the present application are also directed to providing a delay circuit which is capable of generating delayed signals having different delay values by using a small number of unit delay cells. In accordance with an aspect of the present application, there is provided a delay circuit, including: first and second selective delay stages each comprising a number of unit delay cells to delay signals applied thereto; and a delay control unit configured to control selectively applying an input signal to the first selective delay stage or the second selective delay stage in response to a code combination of first and second selection signals and produce an output signal.

In accordance with another aspect of the present application, there is provided a delay circuit, including: a plurality of selective delay stages each comprising a number of unit delay cells to delay signals applied thereto; and a plurality of selection units connected in series and each receiving a selection signal allocated thereto and having a respective one of the plurality of selective delay stages assigned thereto, the selection units being each configured to be responsive to the respective selection signal to select as to whether to pass an input signal of the selection unit through the selective respective delay stage or bypass the selective respective delay stage in producing an output signal of the selection unit, wherein a total number of the selection units equals the total number of bits of the selection signals and the total number of unit delay cells in the respective selective delay stage of each selection unit is greater by one compared to that of the immediately preceding selection unit in the series and the total number of unit delay cells for the first selection unit in the series is one.

In accordance with still another aspect of the present application, there is provided a delay circuit, including: first and second selective delay stages configured to each delay an input signal applied thereto by a certain delay value; a first selection unit configured to be responsive to a first selection signal to select as to whether to pass an input signal of the first selection unit through the first selective delay stage or bypass the first selective delay stage in producing an output signal of the first selection unit; and a second selection unit configured to be responsive to a second selection signal to select as to whether to pass the output signal of the first selection unit through the second selective delay stage or bypass the second selective delay stage in producing an output signal of the second selection unit.

In the delay circuits in accordance with the embodiments of the present application, the plurality of selective delay stages configured to delay the applied signals by the certain delay values are designed to generate the delayed signals having different delay values in response to the code combination of the selection signals. That is, by selectively delaying the initial input signals by the selective delay stages in response to the code combination of the selection signals, the delayed signals having different delay values can be generated using a minimum number of unit delay cells.

DESCRIPTION OF SPECIFIC EMBODIMENTS

Other objects and advantages of the present application can be understood by the following description, and become apparent with reference to the embodiments of the present application. In the drawings and detailed description, since the terms, numerals, and symbols used to indicate devices or blocks may be expressed by sub-units, it should be noted that the same terms, numerals, and symbols may not indicate the same devices in a whole circuit.

Generally, logic signals of a circuit are divided into a high level (H) and a low level (L) according to a voltage level and may be represented by "1" and "0". It will be assumed that, if necessary, the logic signals may have a high impedance (Hi-Z) state. Furthermore, the terms P-channel Metal Oxide Semiconductor (PMOS) and N-channel Metal Oxide Semiconductor (NMOS) used herein are a kind of Metal Oxide Semiconductor Field Effect Transistor (MOSFET).

Figure 2:
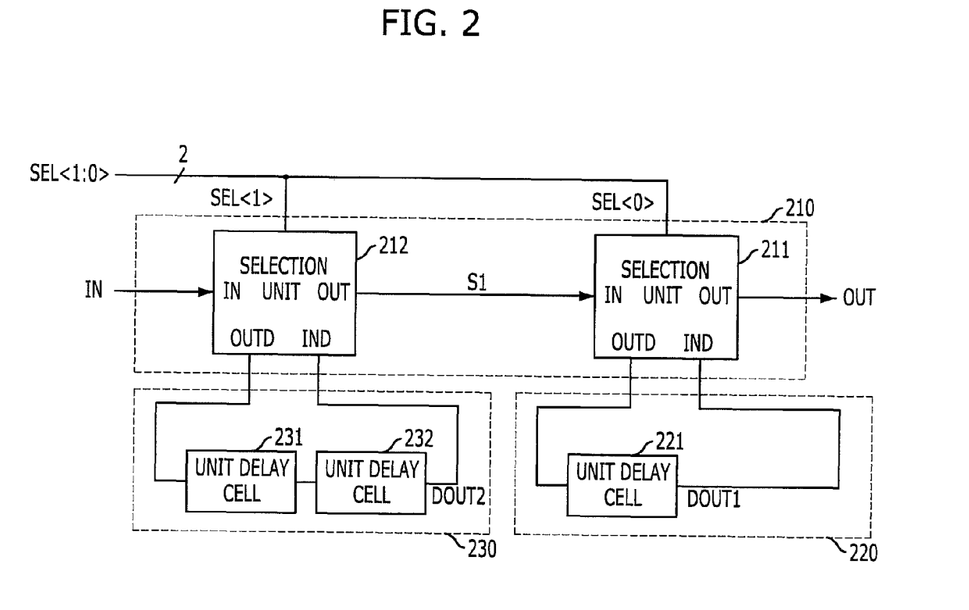
FIG. 2 is a block diagram of a delay circuit in accordance with a first embodiment of the present application.

FIG. 2 is a block diagram of a delay circuit in accordance with a first embodiment of the present application. Referring to FIG. 2, the delay circuit includes a first selective delay stage 220, a second selective delay stage 230, and a delay controller 210. The first selective delay stage 220 includes one unit delay cell 221 to delay an applied signal. The second selective delay stage 230 includes two unit delay cells 231 and 232 to delay an applied input signal. The delay controller 210 exercises a control to apply an input signal IN to the first selective delay stage 220 or the second selective delay stage 230 in response to a code combination of a first selection signal SEL<0> and a second selection signal SEL<1>, or to apply a delayed signal DOUT2 from the second selective delay stage 230 to the first selective delay stage 220. The delay controller 210 may also perform a control to output the input signal IN without delay at the first selective delay stage 220 and the second selective delay stage 230 in response to the code combination of the first selection signal SEL<0> and the second selection signal SEL<1>.

Assuming that the unit delay cells of the first selective delay stage 220 and the second selective delay stage 230 have the same delay values, the code combination of the selection signals SEL<1:0> may have four cases. To be specific, the input signal IN may be outputted without delay, or the input signal IN may be delayed by the delay value of the unit delay cell 221 at the first selective delay stage 220, or the input signal IN may be delayed by the delay value of the two unit delay cells 231 and 232 at the second selective delay stage 230, or the input signal IN may be delayed by the delay value of the three unit delay cells 231, 232 and 221 at the first and second selective delay stages 220 and 230.

A detailed structure and operation of the delay circuit will be described below.

The delay controller 210 includes a first selection unit 211 and a second selection unit 212. The second selection unit 212 outputs the input signal IN through an output terminal OUT or outputs the delayed signal DOUT2 generated by applying the input signal IN to the second selective delay stage 230 through the output terminal OUT in response to the second selection signal SEL<1>. The first selection unit 211 outputs the output signal S1 of the second selection unit 212 through an output terminal OUT or outputs the delayed signal DOUT1 generated by applying the output signal S1 of the second selection unit 212 to the first selective delay stage 220 through the output terminal OUT in response to the first selection signal SEL<0>.

Detailed circuits of the first selection unit 211 and the second selection unit 212 will be described below.

The first selection unit 212 and the second selection unit 212 have the same circuit structure and are controlled by the selection signals SEL<0> and SEL<1>, respectively.

Figure 3:
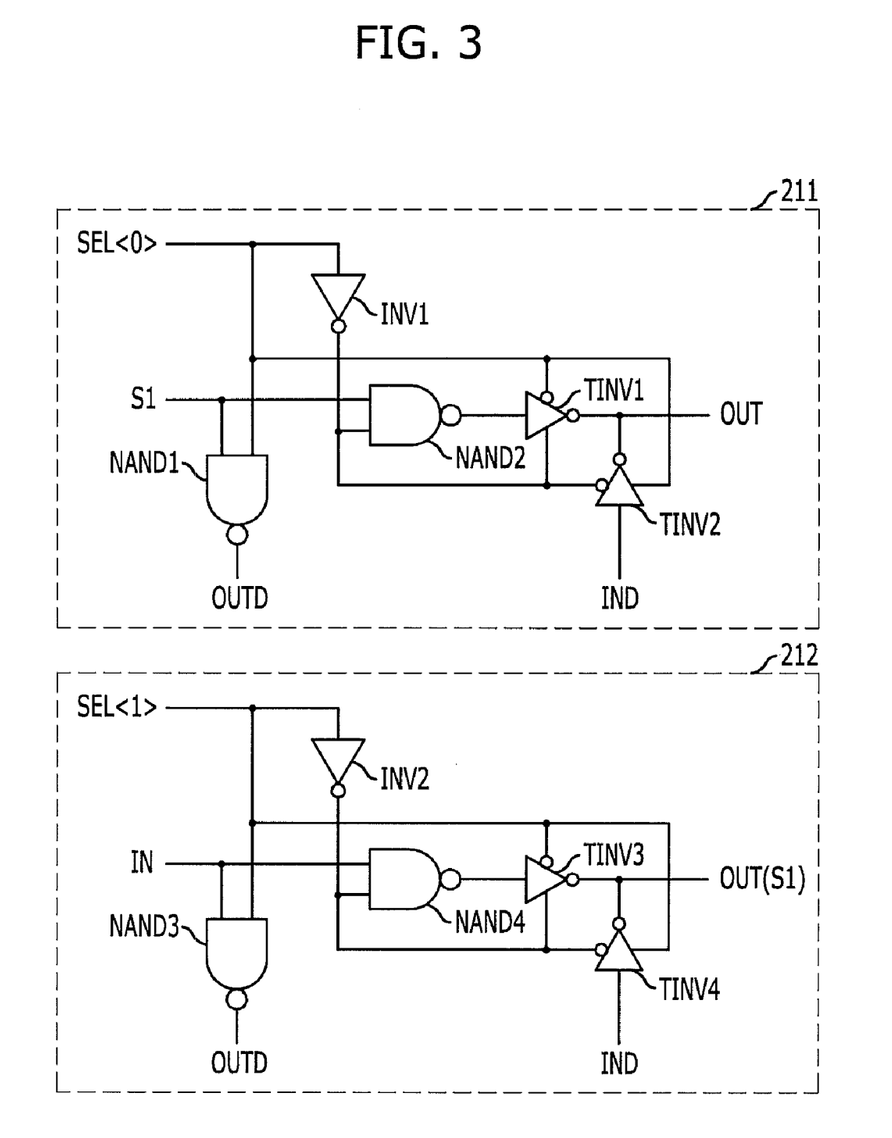
FIG. 3 is a circuit diagram of selection units of FIG. 2.

FIG. 3 is a circuit diagram of the selection units 211 and 212 of FIG. 2. Referring to FIG. 3, the first selection unit 211 includes a first logic combination unit NAND1, a second logic combination unit NAND2, a first switching unit TINV1, and a second switching unit TINV2. The first logic combination unit NAND1 performs a NAND operation on the first selection signal SEL<0> and the output signal S1 of the second selection unit 212 to output the resulting signal to the first selective delay stage 220. The second logic combination unit NAND2 performs a NAND operation on an inverted signal of the first selection signal SEL<0> and the output signal S1 of the second selection unit 212. The first switching unit TINV1 selectively transfers the output signal of the second logic combination unit NAND2 through the output terminal OUT in response to the first selection signal SEL<0> and the inverted signal of the first selected signal SEL<0>. The second switching unit TINV2 selectively transfers the output signal of the first selective delay stage 220 through the output terminal OUT in response to the first selection signal SEL<0> and the inverted signal of the first selection signal SEL<0>. The first switching unit TINV1 or the second switching unit TINV2 is selectively enabled by the first selection signal SEL<0>. In this embodiment, the first switching unit TINV1 and the second switching unit TINV2 may be implemented with tri-state inverters. Accordingly, when the first selection signal SEL<0> is at a low level, the output signal S1 of the second selection unit 212 is outputted through the output terminal OUT without delay. When the first selection signal SEL<0> is at a high level, the output signal S1 of the second selection unit 212 is delayed by the delay value of the first selective delay stage 220 and outputted through the output terminal OUT.

The second selection unit 212 includes a third logic combination unit NAND3, a fourth logic combination unit NAND4, a third switching unit TINV3, and a fourth switching unit TINV2. The third logic combination unit NAND3 performs a NAND operation on the second selection signal SEL<1> and the input signal IN to output the resulting signal to the second selective delay stage 230. The fourth logic combination unit NAND4 performs a NAND operation on an inverted signal of the second selection signal SEL<1> and the input signal IN. The third switching unit TINV3 selectively transfers the output signal of the fourth logic combination unit NAND4 through the output terminal OUT(S1) in response to the second selection signal SEL<1> and the inverted signal of the second selected signal SEL<1>. The fourth switching unit TINV4 selectively transfers the output signal of the second selective delay stage 230 through the output terminal OUT(S1) in response to the second selection signal SEL<1> and the inverted signal of the second selection signal SEL<1>. The third switching unit TINV3 or the fourth switching unit TINV4 is selectively enabled by the second selection signal SEL<1>. In this embodiment, the third switching unit TINV3 and the fourth switching unit TINV4 may be implemented with tri-state inverters. Accordingly, when the second selection signal SEL<1> is at a low level, the input signal IN is outputted through the output terminal OUT (S1) without delay. When the second selection signal SEL<1> is at a high level, the input signal is delayed by the delay value of the second selective delay stage 230 and outputted through the output terminal OUT(S1).

The unit delay cells of the first and second selective delay stages 220 and 230 will be described below in details.

Figure 4:
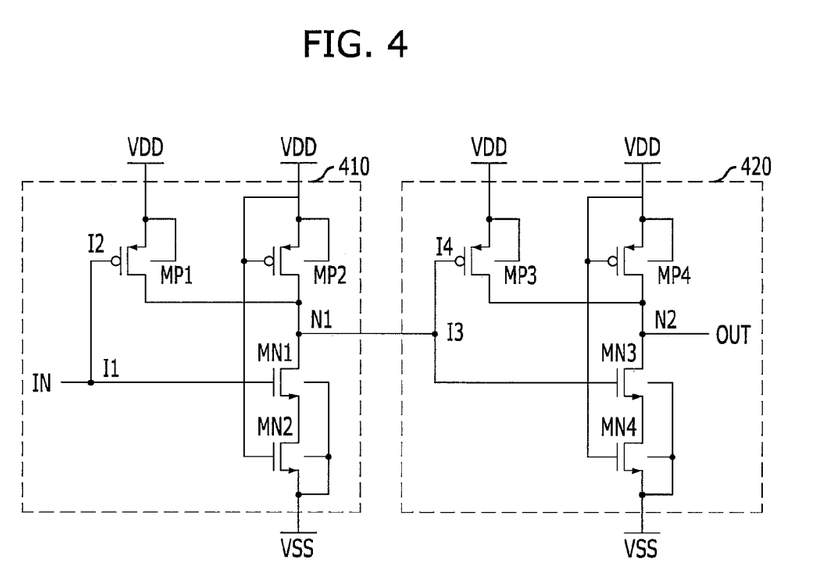
FIG. 4 is a circuit diagram of a unit delay cell of FIG. 2.

FIG. 4 is a circuit diagram of the unit delay cell illustrated in FIG. 2. Referring to FIG. 4, the unit delay cell includes a first NAND unit 410 and a second NAND unit 420 connected in series. The first NAND unit 410 has a first input terminal I1 receiving the input signal IN, and a second input terminal I2 connected to a power supply voltage terminal VDD. The second NAND unit 420 has a first input terminal I3 receiving an output signal of the first NAND unit 410, and a second input terminal I4 connected to the power supply voltage terminal VDD. Accordingly, when the input signal IN is inputted, the first NAND unit 410 delays the input signal IN by a certain delay value and inverts the delayed input signal IN, and the second NAND unit 420 delays the output signal of the first NAND unit 410 by a certain delay value and inverts the delayed signal.

TABLE 1

| SEL<1> | SEL<0> | UNIT DELAY CELL (EA) |
|---|---|---|
| 0 | 0 | 0 |
| 0 | 1 | 1 |
| 1 | 0 | 2 |
| 1 | 1 | 3 |

Table 1 shows the delay values of the delayed signals outputted from the delay circuit of FIG. 2 in response to the selection signals SEL<1:0>. As can be seen from Table 1, any one of a total of four delay values can be selected by the code combination of the first selection signal SEL<0> and the second selection signal <1>.

Meanwhile, the delay values of the selective delay stages are determined by a certain number of the unit delay cells having the same delay value. However, the selective delay stages may also be designed to have different specific delay values in accordance with embodiments. The unit delay cells may be variously modified using inverter chains or the like.

Figure 5:
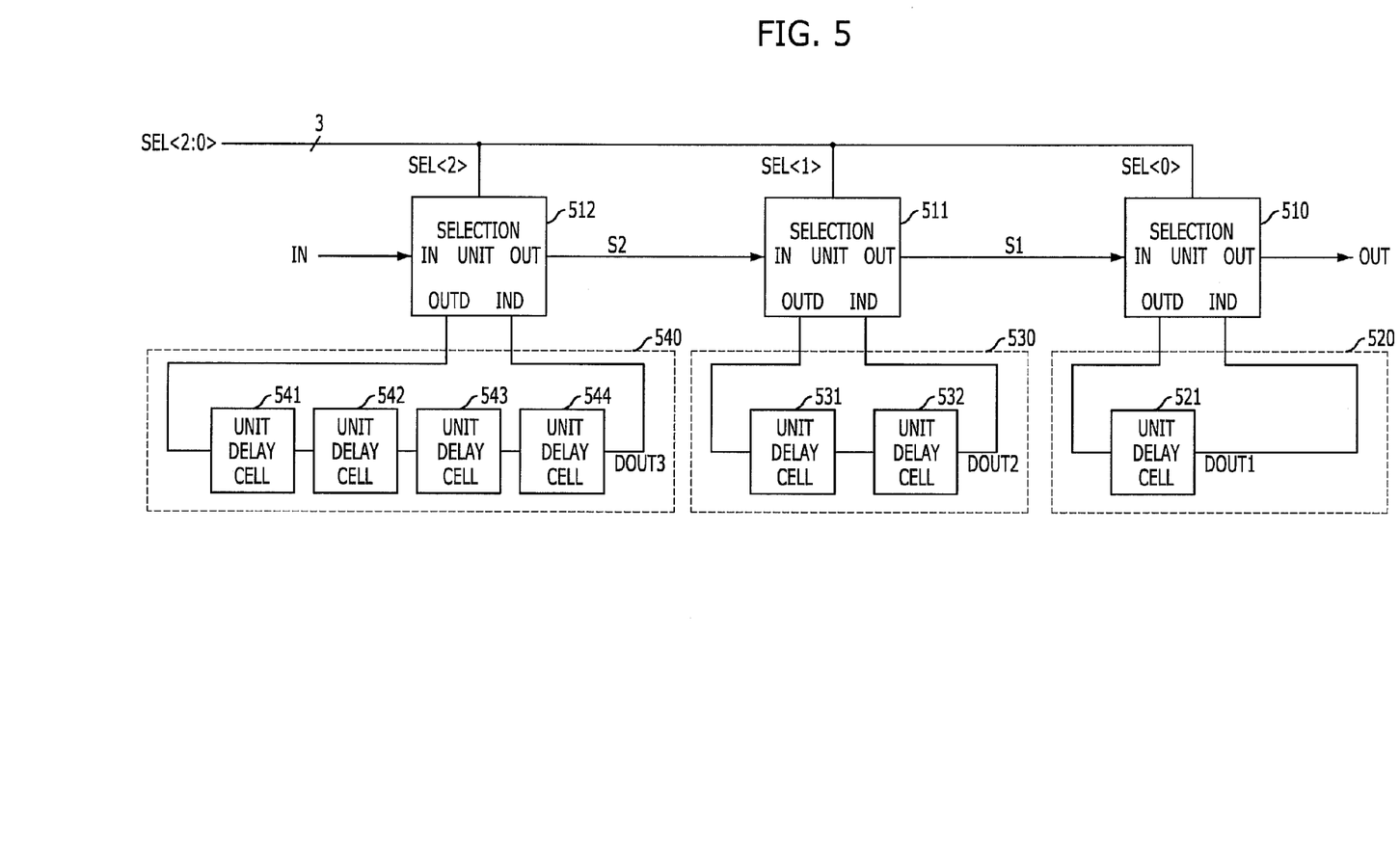
FIG. 5 is a block diagram of a delay circuit in accordance with a second embodiment of the present application.

FIG. 5 is a block diagram of a delay circuit in accordance with a second embodiment of the present application. Referring to FIG. 5, the delay circuit includes a first selective delay stage 520, a second selective delay stage 530, a third selective delay stage 540, a first selection unit 510, a second selection unit 511, and a third selection unit 512. The first selective delay stage 520 includes one unit delay cell 521 to delay an applied signal. The second selective delay stage 530 includes two unit delay cells 531 and 532 to delay an applied signal. The third selective delay stage 540 includes four unit delay cells 541, 542, 543 and 544 to delay an applied signal. The third selection unit 512 is responsive to a third selection signal SEL<2> to output an input signal IN through an output terminal OUT, or to output a delayed signal DOUT3 generated by applying the input signal IN to the third selective delay stage 540 through the output terminal OUT. The second selection unit 511 is responsive to a second selection signal SEL<1> to output an output signal S2 of the third selection unit 512 through an output terminal OUT, or to output a delayed signal DOUT2 generated by applying the output signal S2 of the third selection unit 512 to the second selective delay stage 530. The first selection unit 510 is responsive to a first selection signal SEL<0> to output an output signal S1 of the second selection unit 511 through an output terminal OUT, or to output a delayed signal DOUT1 generated by applying the output signal S1 of the second selection unit 511 to the first selective delay stage 520. The code combination of the selection signals SEL<2:0> may have a total of eight cases. Assuming that the unit delay cells of the first to third selective delay stages 520, 530 and 540 have the same delay value, delayed signals can be finally generated by selectively applying the eight delay values in response to the code combination of the first to third selection signals SEL<2:0>.

TABLE 2

| SEL<2> | SEL<1> | SEL<0> | UNIT DELAY CELL (EA) |
|---|---|---|---|
| 0 | 0 | 0 | 0 |
| 0 | 0 | 1 | 1 |
| 0 | 1 | 0 | 2 |

TABLE 2-continued

| SEL<2> | SEL<1> | SEL<0> | UNIT DELAY CELL (EA) |
|---|---|---|---|
| 0 | 1 | 1 | 3 |
| 1 | 0 | 0 | 4 |
| 1 | 0 | 1 | 5 |
| 1 | 1 | 0 | 6 |
| 1 | 1 | 1 | 7 |

Table 2 shows delay values of the delayed signals outputted from the delay circuit of FIG. 5 in response to the code combination of the first to third selection signals SEL<2:0>. As can be seen from Table 2, any one of the eight delay values can be selected by the code combination of the first to third selection signals SEL<2:0>.

Meanwhile, the delay circuits in accordance with the embodiments of FIGS. 2 and 5 are designed for a case where the selection signal has 2 bits and 3 bits, respectively. A circuit for generating delayed signals having different delay values by using a minimum number of selection signals and unit delay cells may be configured as follows.

Figure 6:
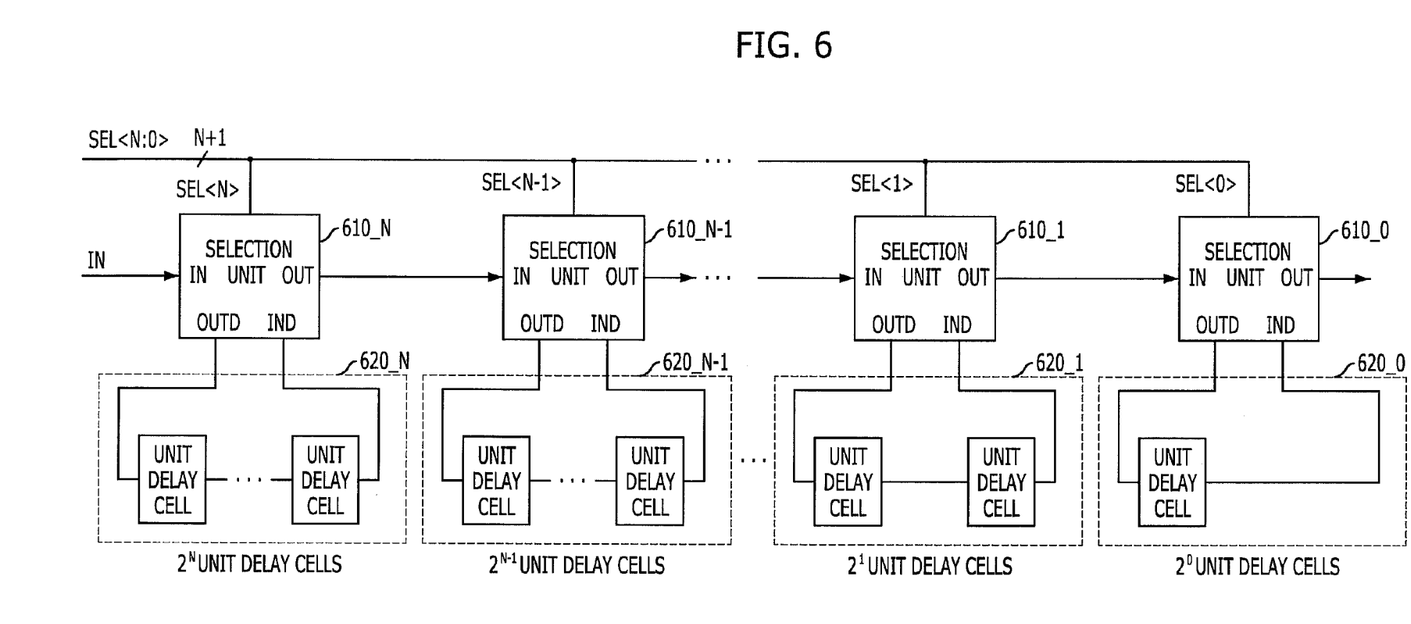
FIG. 6 is a block diagram of a delay circuit in response to an embodiment of the present application.

FIG. 6 is a block diagram of a delay circuit in accordance with an embodiment of the present application. Referring to FIG. 6, the delay circuit includes a plurality of selective delay stages 620_0 to 620_N and a plurality of selection units 610_0 to 610_N. Each of the selective delay stages 620_0 to 620_N includes a certain number of unit delay cells to delay an applied signal. The selection units 610_0 to 610_N receive selection signals SEL<N:0> allocated thereto and are connected in series. The selection units 610_0 to 610_N are responsive to the selection signals SEL<i> to transfer their applied signals to the corresponding selection unit 610_j, or to transfer the delayed signals, which are generated by applying the applied signals to the corresponding selective delay units 620_j, to the corresponding selection units 610_j, respectively.

The selective delay stages 620_0 to 620_N and the selection units 610_0 to 610_N are provided to match, in number, the bit numbers (N+1 bits, where N is zero or a positive integer) of the selection signals SEL<N:0>. Moreover, the selective delay stages 620_0 to 620_N include $2^N$ unit delay cells, $2^{N-1}$ unit delay cells, ..., $2^1$ unit delay cells, and $2^0$ unit delay cell, respectively.

When the delay circuit is implemented as illustrated in FIG. 6, the size of the delay circuit can be remarkably reduced because the delayed signals having various delay values are generated with a minimum number of the selection signals and the unit delay cells.

In accordance with the embodiments of the present application, the delayed signals having various delay values can be generated using a minimum number of unit delay cells, and the delay values can be adjusted through a small number of selection signals. Thus, the delay circuit can be designed in a very small size. Therefore, integrated circuits using the delay circuits in accordance with the embodiments of the present application are more advantageous in regard to circuit area and power consumption.

While the present application has been described with respect to the specific embodiments, it will be apparent to those skilled in the art that various changes and modifications may be made without departing from the spirit and scope of the application as defined in the following claims.

For example, for further detailed description, embodiments including additional elements, which are not directly related to the technical spirit of the present application, may be provided. Also, the active high or active low structure representing activation states of signals and circuits may be changed in accordance with embodiments. Furthermore, the structure of transistors may be modified if necessary for implementation of the same functions. That is, PMOS transistors and NMOS transistors may be replaced one another, and they may be implemented using various types of transistors. Moreover, if necessary for implementation of the same functions, the structures of logic gates may be modified. That is, NAND circuits, NOR circuits or the like may be implemented by various combinations of NAND gates, NOR gates, and inverters. A numerous circuit modification may be made. Such a modification may be easily derived by those skilled in the art, and thus, its enumeration will be omitted.

What is claimed is:

1. A delay circuit, comprising:
    first and second selective delay stages each including a predetermined number of unit delay cells to delay signals applied thereto; and
    a delay control unit configured to receive first and second selection signals, to control selectively applying an input signal to one or both of the first and second selective delay stages in response to the first and second selection signals, and to produce an output signal,
    wherein the predetermined number of unit delay cells included in the first selective delay stage is $2^{N-1}$, and the predetermined number of unit delay cells included in the second selective delay stage is $2^N$, where N is a positive integer.

2. The delay circuit of claim 1, wherein the delay control unit is configured to select as to whether to pass the input signal through the first selective delay stage or bypass the first selective delay stage in producing the output signal, wherein the selection is made based on a code combination of the first and second selection signals.

3. The delay circuit of claim 1, wherein the delay control unit is configured to control outputting of the input signal as the output signal by bypassing the first and second selective delay stages in producing the output signal in response to a code combination of the first and second selection signals.

4. The delay circuit of claim 2, wherein the delay control unit comprises:
    a first selection unit configured to be responsive to the first selection signal to selectively output the input signal as an output signal of the first selective delay stage; and
    a second selection unit configured to be responsive to the second selection signal to selectively output the output signal of the first selection unit as an output signal of the second selective delay unit.

5. The delay circuit of claim 4, wherein the first selection unit comprises:
    a first logic combination unit configured to perform a NAND operation on the first selection signal and the input signal to output a resulting signal of the NAND operation to the first selective delay stage;
    a second logic combination unit configured to perform a NAND operation on an inverted signal of the first selection signal and the input signal;
    a first switching unit configured to selectively transfer an output signal of the second logic combination unit to a first output terminal of the first selection unit in response to the first selection signal and the inverted signal of the first selection signal; and
    a second switching unit configured to selectively transfer an output signal of the first selective delay stage to the first output terminal in response to the first selection signal and the inverted signal of the first selection signal,
    wherein one of the first and second switching units is selectively enabled at a time.

6. The delay circuit of claim 5, wherein the first and second switching units are configured to be implemented with tri-state inverters.

7. The delay circuit of claim 4, wherein the second selection unit comprises:
    a first logic combination unit configured to perform a NAND operation on the second selection signal and the output signal of the first selection unit to output a resulting signal of the NAND operation to the second selective delay stage;
    a second logic combination unit configured to perform a NAND operation on an inverted signal of the second selection signal and the output signal of the first selection unit;
    a first switching unit configured to selectively transfer an output signal of the second logic combination unit to a second output terminal of the second selection unit in response to the second selection signal and the inverted signal of the second selection signal; and
    a second switching unit configured to selectively transfer an output signal of the second selective delay stage to the second output terminal in response to the second selection signal and the inverted signal of the second selection signal,
    wherein one of the first and second switching units is selectively enabled at a time.

8. The delay circuit of claim 7, wherein the first and second switching units are configured to be implemented with tri-state inverters.

9. A delay circuit, comprising:
    a plurality of selective delay stages each including a number of unit delay cells to delay signals applied thereto; and
    a plurality of selection units connected in series and each receiving a selection signal allocated thereto and having a respective one of the plurality of selective delay stages assigned thereto, the selection units each being configured to be responsive to the respective selection signal to select as to whether to pass an input signal of the selection unit through the respective selective delay stage or bypass the respective selective delay stage in producing an output signal of the selection unit,
    wherein a total number of the selection units equals the total number of bits of the selection signals and the total number of unit delay cells in the respective selective delay stage of each selection unit is greater by one compared to that of the immediately preceding selection unit in the series and the total number of unit delay cells for the first selection unit in the series is one.

10. A delay circuit, comprising:
    first and second selective delay stages each configured to delay an input signal applied thereto by a certain delay value;
    a first selection unit configured to be responsive to a first selection signal to select as to whether to pass an input signal of the first selection unit through the first selective delay stage including a predetermined number of unit delay cells or bypass the first selective delay stage in producing an output signal of the first selection unit; and
    a second selection unit configured to be responsive to a second selection signal to select as to whether to pass the output signal of the first selection unit through the second selective delay stage including a predetermined number of unit delay cells or bypass the second selective delay stage in producing an output signal of the second selection unit, wherein the predetermined number of unit delay cells included in the first selective delay stage is $2^{N-1}$, and the predetermined number of unit delay cells included in the second selective delay stage is $2^N$, where N is a positive integer.

11. A delay circuit, comprising:
a plurality of selective delay stages each including a predetermined number of unit delay cells to delay signals applied thereto; and
a plurality of selection units connected in series and receiving selection signals allocated thereto, the selection units being configured to be responsive to the respective selection signals to output input signals, or to transfer delayed signals, which are generated by applying the input signals to the corresponding selective delay stages to the corresponding selection units,
wherein the number of the selective delay stages and the number of the selection units both equal N, where N is a positive integer and is the number of bits of the selection signals, the selective delay stages include $1^{st}$ to $N^{th}$ selective delay stages, and the $i^{th}$ selective delay stage of the selective delay stages comprises $2^{i-1}$ unit delay cells, where i is each integer from 1 to N.

* * * * *